United States Patent [19]

Chang et al.

[11] Patent Number: 6,052,025
[45] Date of Patent: Apr. 18, 2000

[54] CMOS OPERATIONAL AMPLIFIERS HAVING REDUCED POWER CONSUMPTION REQUIREMENTS AND IMPROVED PHASE MARGIN CHARACTERISTICS

[75] Inventors: Dong-Young Chang; You-Mi Lee; Seung-Hoon Lee, all of Seoul; Geun-Soon Kang; Hee-Cheol Choi, both of Kyunggi-do, all of Rep. of Korea

[73] Assignee: Samsung Electronics Co., Ltd., Rep. of Korea

[21] Appl. No.: 09/124,599

[22] Filed: Jul. 29, 1998

[30] Foreign Application Priority Data

Jul. 29, 1997 [KR] Rep. of Korea ................ 97-35816

[51] Int. Cl.[7] ................................................. H03F 3/45
[52] U.S. Cl. ................................. 330/253; 330/258
[58] Field of Search ................................. 330/253, 257, 330/258, 261

[56] References Cited

U.S. PATENT DOCUMENTS

| | | | |
|---|---|---|---|
| 4,533,876 | 8/1985 | Hague et al. | 330/253 |
| 4,714,895 | 12/1987 | Nicollini et al. | 330/258 |
| 4,820,998 | 4/1989 | Roessler et al. | 330/258 |
| 5,117,199 | 5/1992 | Wang et al. | 330/258 |
| 5,166,635 | 11/1992 | Shih | 330/253 |
| 5,442,318 | 8/1995 | Badyal et al. | 330/258 |
| 5,515,003 | 5/1996 | Kimura | 330/253 |

*Primary Examiner*—Benny Lee
*Assistant Examiner*—Khanh V. Nguyen
*Attorney, Agent, or Firm*—Myers Bigel Sibley & Sajovec

[57] ABSTRACT

Operational amplifier integrated circuits include a differential input stage, a cascode current mirror, a cascode current source and a preferred bias signal generator which is responsive to a clock signal and is electrically coupled to the differential input stage, the cascode current mirror and the cascode current source. This preferred bias signal generator sequentially enables the cascode current mirror and then the differential input stage in response to a rising edge of the clock signal and disables the cascode current mirror and the cascode current source in response to a falling edge of the clock signal. This sequential enablement of the cascode current mirror before the differential input stage improves the unity gain phase margin characteristics of the circuit and the disablement of the cascode current mirror and the cascode current source in response to the falling edge of the clock signal decreases the power consumption requirements of the circuit.

22 Claims, 8 Drawing Sheets

CMOS OPERATIONAL AMPLIFIERS HAVING REDUCED POWER CONSUMPTION REQUIREMENTS AND IMPROVED PHASE MARGIN CHARACTERISTICS

FIELD OF THE INVENTION

The present invention relates to integrated circuits, and more particularly to integrated circuits containing operational amplifiers therein.

BACKGROUND OF THE INVENTION

Operational amplifiers, more commonly known as "op-amps", are the core component in analog integrated circuits ("ICs"). An ideal operational amplifier has a differential input, single-ended or differential-ended output, infinite gain, infinite input impedance and zero output impedance.

The rapidly increasing complexity of functions performed by integrated circuits has resulted in a need to implement complete analog-digital subsystems on a single integrated circuit substrate. For this reason, implementation of certain analog functions in Metal-Oxide-Semiconductor ("MOS") technology has become increasingly important. Because operational amplifiers are key elements to most analog subsystems, such as switched capacitor filters or analog-to-digital (A/D) converters, performance of such analog-digital subsystems is strongly influenced by operational amplifier characteristics.

In designing an operational amplifier, it is important to consider various advantages and drawbacks associated with each of the amplifier configurations such as common emitter ("CE"), common base ("CB") and common collector ("CC"). For instance, a specific property of an amplifier configuration can be enhanced, a certain deficiency can be remedied and/or a special feature can be added by combining two configurations together (e.g., CC-CC, CC-CE, CC-CB, CE-CE and CE-CB).

The CE-CB configuration, usually referred to as a cascode amplifier, has basically the same input characteristics as the CE amplifier and the same output characteristics as the CB amplifier. In particular, the cascode amplifier has high output resistance which can be useful in achieving a large amount of voltage gain. High frequency feedback is also limited and the Miller capacitance is reduced because the voltage gain of the CE configuration is very low. Therefore, the CE-CB (or cascode) configuration is inherently stable and well suited for high-frequency applications.

In a system comprising an analog integrated circuit or a very large mixed-mode integrated circuit consisting of analog and digital integrated circuits, one of the integrated circuits consuming a relatively large amount of power may be the operational amplifier. Accordingly, to implement a low power system, it is important to design operational amplifiers which have reduced power consumption requirements

SUMMARY OF THE INVENTION

It is therefore an object of the present invention to provide improved operational amplifier integrated circuits.

It is another object of the present invention to provide operational amplifier integrated circuits having reduced power consumption requirements.

It is still another object of the present invention to provide operational amplifier integrated circuits having improved phase margin characteristics.

These and other objects, features and advantages of the present invention are provided by operational amplifier integrated circuits which comprise a differential input stage, a cascode current mirror, a cascode current source and a preferred bias signal generator which is responsive to a clock signal and is electrically coupled to the differential input stage, the cascode current mirror and the cascode current source. This preferred bias signal generator sequentially enables the cascode current mirror and then the differential input stage in response to a rising edge of the clock signal and disables the cascode current mirror and the cascode current source in response to a falling edge of the clock signal. This sequential enablement of the cascode current mirror before the differential input stage improves the unity gain phase margin characteristics of the circuit and the disablement of the cascode current mirror and the cascode current source in response to the falling edge of the clock signal decreases the power consumption requirements of the circuit.

Moreover, according to a preferred aspect of one embodiment of the present invention, the cascode current mirror is electrically coupled to the differential input stage and also between a differential output and a first reference potential (e.g., Vdd). The cascode current source is also preferably electrically coupled to the differential input stage and between the differential output and a second reference potential (Vss). In addition, the differential input stage comprises first and second differential amplifiers. The first differential amplifier has a differential output electrically coupled to the cascode current mirror and the second differential amplifier has a differential output electrically coupled to the cascode current source. The first differential amplifier comprises first and second NMOS transistors having respective gate electrodes electrically coupled to a differential input and the second differential amplifier comprises first and second PMOS transistors having respective gate electrodes electrically coupled to the differential input. The first differential amplifier also comprises a third NMOS transistor having a drain electrode electrically connected to source electrodes of the first and second NMOS transistors and the second differential amplifier comprises a third PMOS transistor having a drain electrode electrically connected to source electrodes of the first and second PMOS transistors. The third NMOS transistor also has a gate electrode and a source electrode electrically connected to the bias signal generator and the second reference potential, respectively, and the third PMOS transistor has a gate electrode and a source electrode electrically connected to the bias signal generator and the first reference potential, respectively.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete and will fully convey the scope of the invention to those skilled in the art. Like numbers refer to like elements throughout.

Figure 1A:
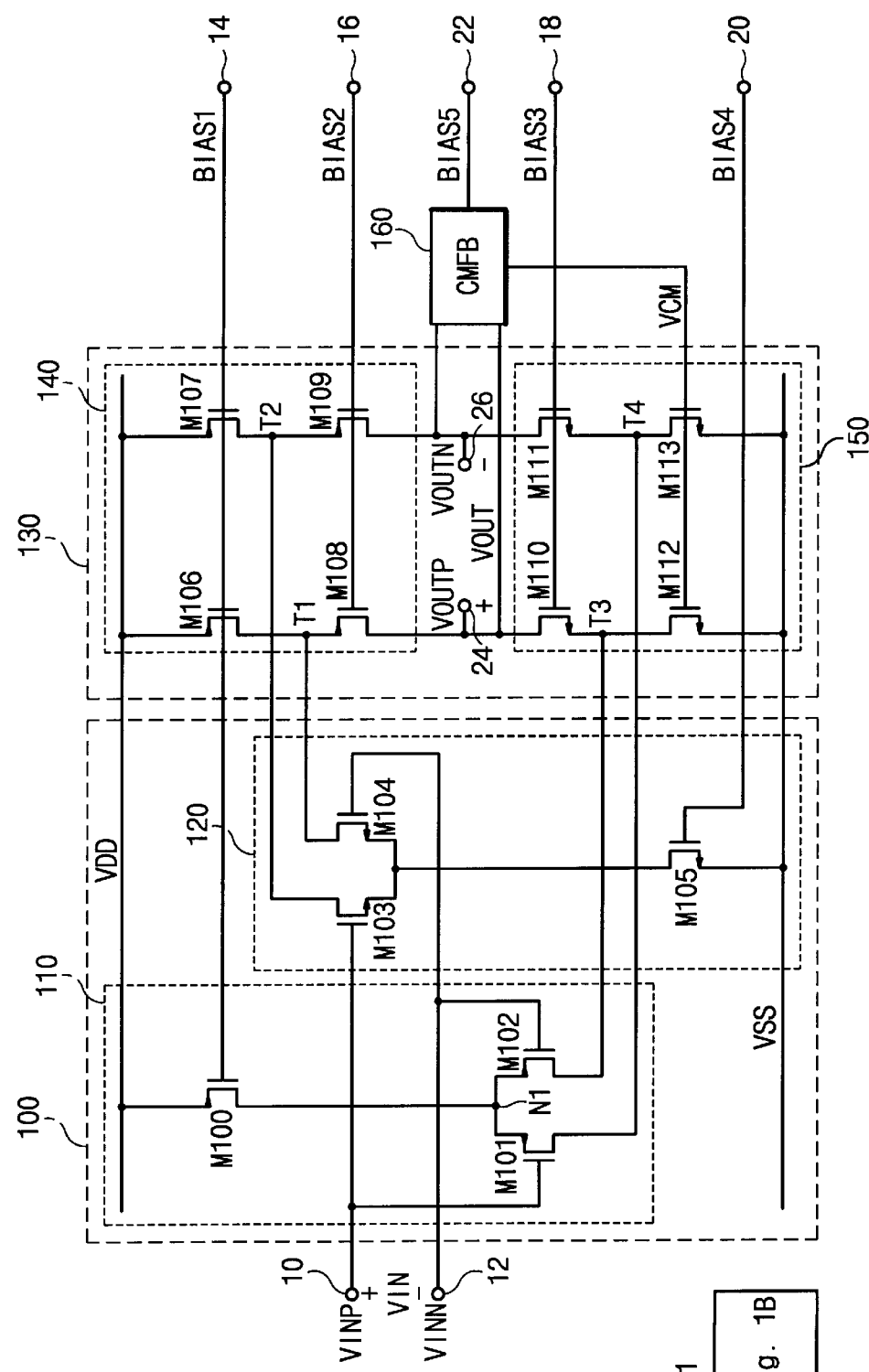
FIGS. 1A and 1B are an electrical schematic of a fully differential folded cascode CMOS operational amplifier according to a first embodiment of the present invention.

Referring to FIG. 1, a detailed circuit diagram of a fully differential folded cascode CMOS operational amplifier 200 having both a common mode feedback section 160 and a bias circuit 170 according to a first preferred embodiment of the present invention is illustrated. Referring to FIG. 1, the fully differential folded cascode CMOS operational amplifier 200 has a differential input and a differential output. The differential input is comprised of a positive input terminal 10 and a negative input terminal 12, and the differential output is comprised of a positive output terminal 24 and a negative output terminal 26. An input voltage signal VIN is applied across the input terminals 10 and 12. The input voltage VIN includes two single-ended input voltages VINP and VINN applied to input terminals 10 and 12, respectively. An output voltage VOUT signal is established across the output terminals 24 and 26. The output voltage VOUT includes two single-ended output voltages VOUTP and VOUTN applied on output terminals 24 and 26, respectively. The operational amplifier 200, as shown in FIG. 1, comprises an input stage 100 consisting of a P-channel input section 110 and an N-channel input section 120.

The P-channel input section 110 comprises three P-channel MOS field effect transistors (hereinafter, referred to as PMOS transistors) M100, M101 and M102 constituting a differential amplifier. The PMOS transistor M100 acts as a bias current source for the input PMOS transistors M101 and M102. A positive differential input terminal 10 is connected to a gate of the PMOS transistor M101 for receiving a corresponding input voltage VINP. A negative differential input terminal 12 is connected to a gate of the PMOS transistor M102 for receiving a corresponding input voltage VINN. Sources of the transistors M101 and M102 are connected together to form a common source node N1 that is coupled to the current source. A source of the PMOS transistor M100 is connected to a power supply voltage VDD and a drain thereof is coupled to the common source node N1. Moreover, a gate of the transistor M100 receives a bias voltage BIAS1 through a terminal 14 from a bias circuit 170.

The N-channel input section 120 is comprised of three N-channel MOS field effect transistors (hereinafter, referred to as NMOS transistors) M103, M104 and M105 constituting a differential amplifier. The NMOS transistor M105 acts as a bias current source for the input NMOS transistors M103 and M104. Gates of the transistors M103 and M104 are connected to the positive and negative differential input terminals 10 and 12, respectively. Sources of the transistors M103 and M104 are commonly coupled to a drain of the transistor M105. A source of the transistor M105 is connected to a ground voltage VSS. The gate of NMOS transistor M105 receives a bias voltage BIAS4 through a terminal 20.

As shown in FIG. 1, the operational amplifier 200 further includes a folded cascode gain stage 130 composed of a cascode current mirror section 140 having four PMOS transistors M106 to M109 and a cascode current source section 150 having four NMOS transistors M110 to M113. The cascode current mirror 140 comprises two current sources. One of the two current sources is comprised of the transistors M106 and M108 and is connected to the output terminal 24. The other is comprised of the transistors M107 and M109 and is coupled to the output terminal 26. The current sources connected to the terminals 24 and 26 are comprised as mirrors of the input section biasing current source. Current paths of the transistors M106 and M108 are formed in series between the power supply voltage VDD and the output terminal 24. A gate of the transistor M106 is connected to a terminal 14 for receiving a bias voltage BIAS1 from the bias circuit 170, and a gate of the transistor M108 receives a bias voltage BIAS2 from a terminal 16. Current paths of the transistors M107 and M109 are formed in series between both the power supply voltage VDD and the output terminal 26 and their gates are connected to the terminals 14 and 16 in that order. A node T2 between the transistors M107 and M109 is connected to a drain of the NMOS transistor M103, and a node T1 between the transistors M106 and M108 is connected to a drain of the NMOS transistor M104.

The cascode current source section 150 comprises two current sources. As illustrated in FIG. 1, one of the two current sources is composed of two NMOS transistors M110 and M112 and the other is composed of two NMOS transistors M1 and M113. The one current source is coupled to the output terminal 24 and the other current source is coupled to the output terminal 26. The transistor M110 (a gate of which receives a bias voltage BIAS3 from a terminal 18) has a drain connected to the output terminal 24 and the transistor M112 (a gate of which receives a voltage VCM from a common mode feedback section 160) has a source connected to the ground voltage VSS. A node T3 between the transistor M110 and the transistor M112 is coupled to the common source node N1 through the transistor M102 of the P-channel input section 110. Current paths of the transistors M111 and M113 are formed in series between the output terminal 26 and the ground voltage VSS. A gate of the transistor M111 receives the bias voltage BIAS3, and a gate of the transistor M113 receives a common mode voltage VCM from the common mode feedback section 160. A node T4 between the transistor M1 and the transistor M113 is connected to the common source node N1 through the transistor M110 of the P-channel input section 110. The drains of PMOS transistors M101 and M102 of the P-channel input section 110 serve as a differential output pair. The nodes T3 and T4 of the cascode current source section 150 being connected to the drains of the PMOS transistors M101 and M102, respectively, serve as a differential input pair. Similarly, the drains of the NMOS transistors M103 and M104 serve as a differential input pair, and the nodes T1 and T2 of the cascode current mirror section 140 which are coupled to the drains of the NMOS transistors M103 and M104, respectively, serve as a differential output pair.

The N-channel input section 120 is an N-channel version of the P-channel input section 110, as is known in the art of analog design. Alternatively, the N-channel input section can be used and the P-channel input section can be omitted. However, the use of both the P-channel input section 110 and the N-channel input section 120 is preferred because it allows the input signal VIN to extend over the entire voltage range of the power supply. The elimination of one of the input sections simply reduces the input voltage range by a transistor threshold voltage.

Figure 1B:
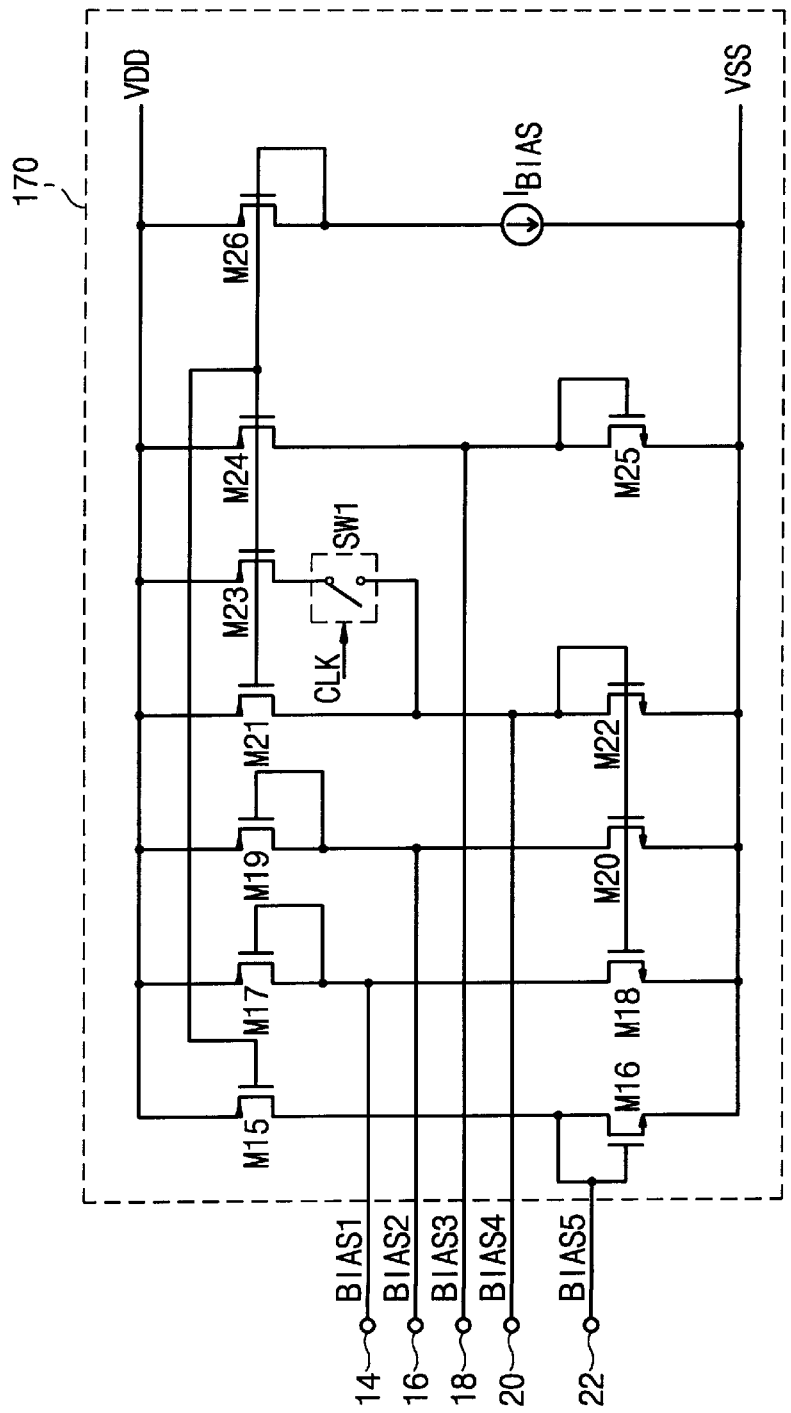

Referring still to FIG. 1, the bias circuit 170 generates the bias voltages BIAS1, BIAS2, BIAS3, BIAS4 and BIAS5 at levels corresponding to a normal mode of operation when a clock signal CLK is activated at a logic high level (e.g., the power supply voltage VDD). The bias circuit 170 is comprised of seven PMOS transistors M15, M17, M19, M21, M23, M24 and M26, five NMOS transistors M16, M18, M20, M22 and M25, one switch element SW1 controlled by the clock signal CLK and a current source $I_{BIAS}$ connected as illustrated in FIG. 1B.

With the circuit configuration as mentioned above in FIG. 1, the operational amplifier 200 is operated during one half cycle of the clock signal CLK and cannot be operated during the other half cycle of the clock signal CLK. Therefore, if there is no current supplied through the PMOS transistor M21, the power consumed by the operational amplifier is reduced by about 50%. Because the PMOS transistor M21 is turned on during the other half cycle of the clock signal CLK and a predetermined amount of current is supplied into the stages 100 and 130, the power saving ratio of the operational amplifier 200 is slightly reduced. This enables the operational amplifier 200 to be operated during a half cycle of the clock signal CLK and conserve power.

Figure 2A:
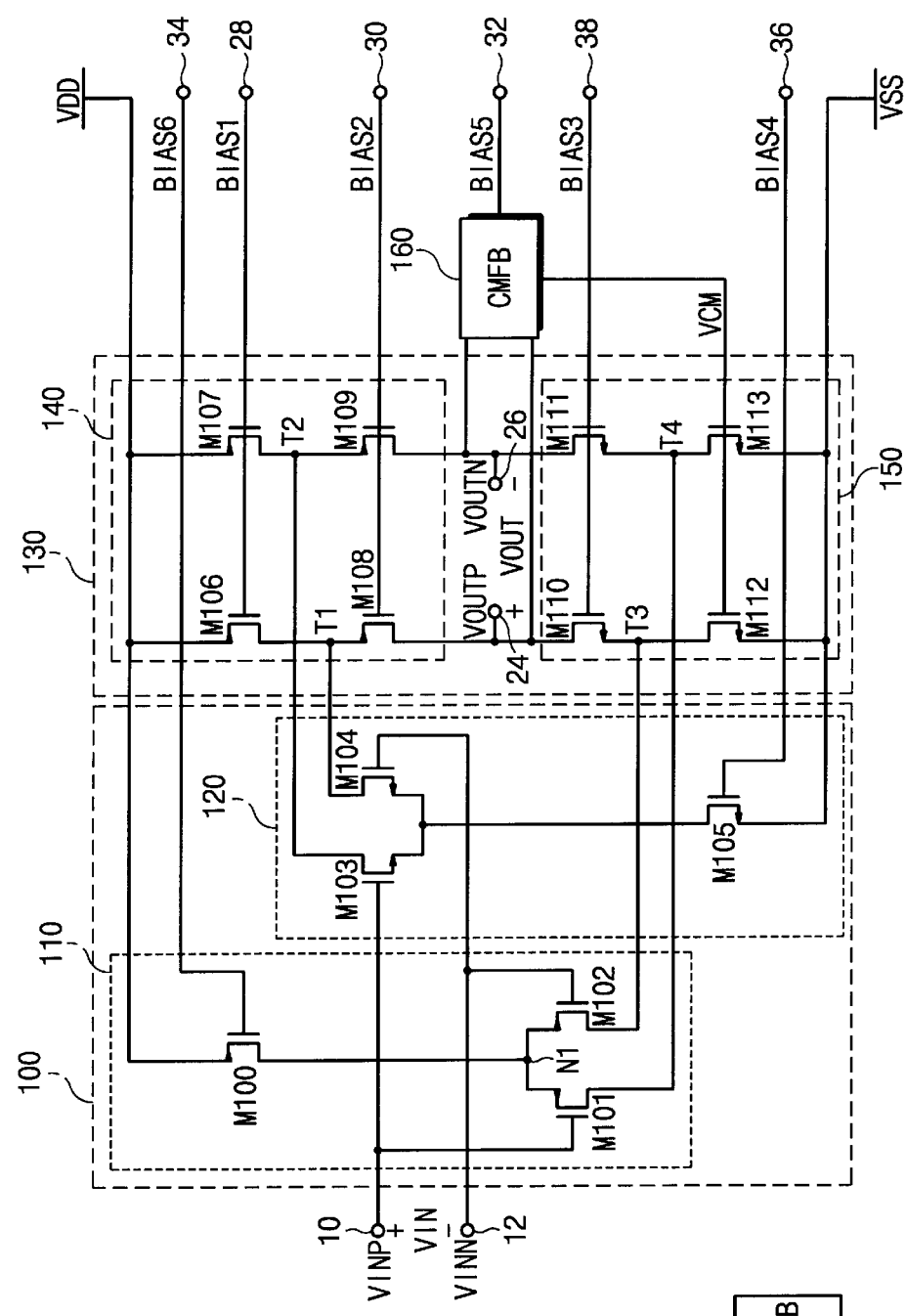
FIGS. 2A and 2B are an electrical schematic of a fully differential folded cascode CMOS operational amplifier according to a second embodiment of the present invention.
Figure 2B:
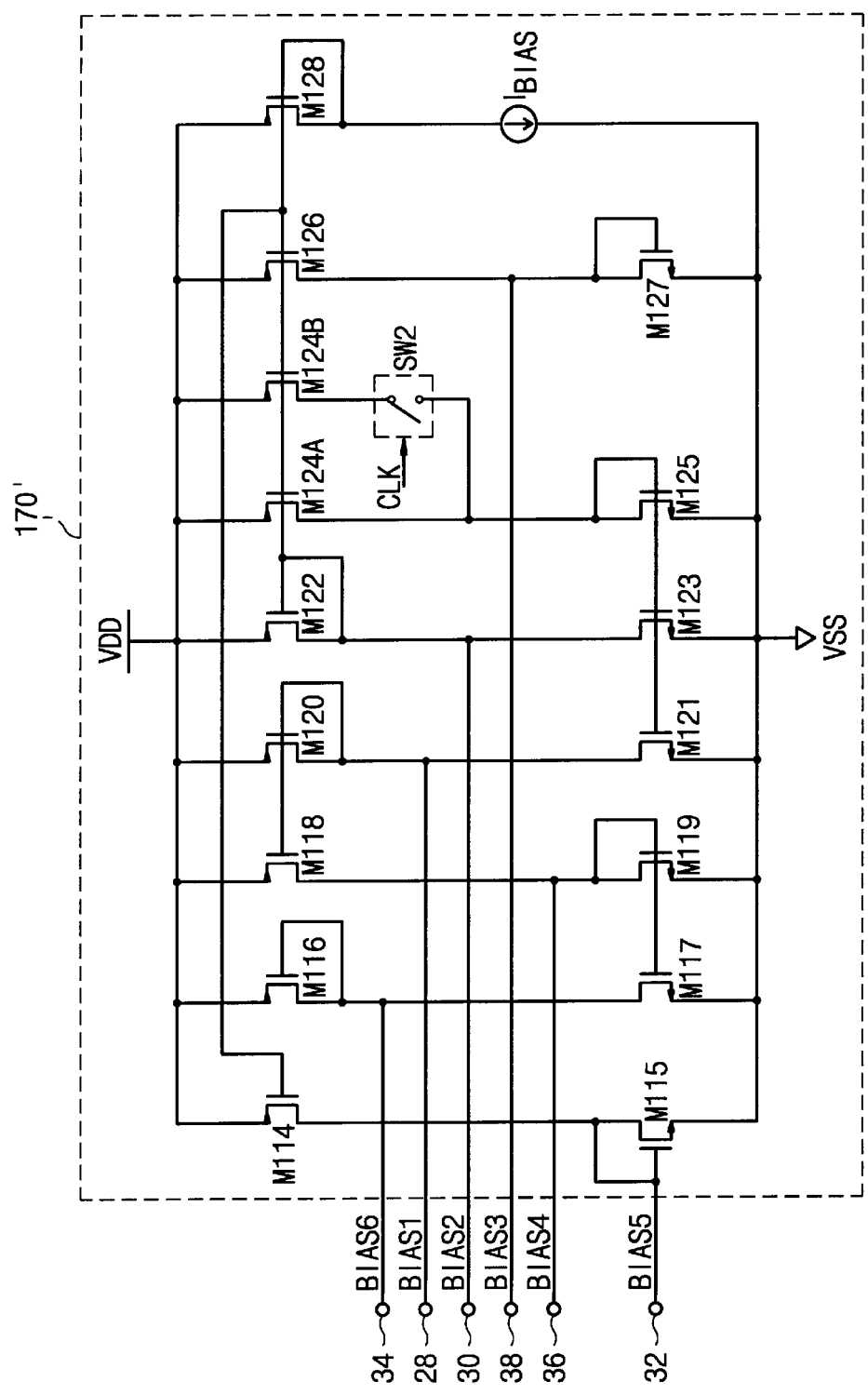

Referring now to FIG. 2, there is a circuit diagram showing a fully differential folded cascode CMOS operational amplifier 200' having a common mode feedback section 160 and a bias circuit 170' according to a second preferred embodiment of the present invention. In FIG. 2, the constituent elements that are identical to those in the first embodiment of FIG. 1 are labeled with the same reference numerals. The input stage 100 and the folded cascode gain stage 130 of this embodiment differ from those of FIG. 1 only in that the bias voltage BIAS1 which is supplied to gates of the PMOS transistors M100, M106 and M107 in FIG. 1 is separated into two bias voltages BIAS1 and BIAS6.

The fully differential folded cascode CMOS operational amplifier 200' shown in FIG. 2 has a dominant pole $\omega_{p1}$ at an output stage, and has a second pole $\omega_{p2}$ equal to or approximately equal to the dominant pole at terminals T1, T2, T3 and T4. Because the hole mobility of a PMOS transistor is less than that of an NMOS transistor as well-known to those skilled in the art, a channel width-to-length ratio of the PMOS transistor may be at least twice as large as that of the NMOS transistor. The pole at the terminals T1 and T2 (which have a parasitic capacitance more than that of the terminals T3 and T4) may affect the operation of the operational amplifier. Therefore, considering mainly the pole at the terminals T1 and T2, a phase margin $\Phi_{PM}$ for the unit gain frequency can be expressed as follows:

$$\Phi_{PM} \cong 90° - \tan^{-1}\left(\frac{\omega_{unity}}{\omega_{P2}}\right)$$
$$= 90° - \tan^{-1}\left(\frac{g_{mn}/C_L}{g_{mp}/C_P}\right)$$

where $g_{mn}$ is an input transconductance value corresponding to the sum of transconductances of the P- and N-channel input sections 110 and 120, $g_{mp}$ is a transconductance value of the PMOS transistor M109 of the cascode current mirror section 140, $C_L$ represents a load capacitance value of the output stage and $C_P$ represents a parasitic capacitance at the terminal T2. In order to obtain a stabilized output voltage VOUT signal, the phase margin $\Phi_{PM}$ of the output stage of the fully differential folded cascode CMOS operational amplifier 200 should be improved. In the equation, it is important that the $g_{mn}$ value always be maintained less than the $g_{mp}$ value.

Referring again to FIG. 2, a preferred bias circuit 170' includes nine PMOS transistors M114, M116, M118, M120, M122, M124A, M124B, M126 and M128, seven NMOS transistors M115, M117, M119, M121, M123, M125 and M127, one switch element SW2 controlled by the clock signal CLK and a current source $I_{BIAS}$. The current paths of the PMOS transistor M114 and the NMOS transistor M115 are formed in series between the power supply voltage VDD and the ground voltage VSS. A gate of the NMOS transistor M115 is connected to a terminal 32 for outputting a bias voltage (or, a bias current) BIAS5. The bias voltage BIAS5 is supplied to the common mode feedback section 160. The PMOS transistor M116 has a gate which is connected to its drain and a source which is coupled to the power supply voltage VDD. The drain of PMOS transistor M116 is also connected to the terminal 34 for outputting the bias voltage (or, a bias current) BIAS6, which is supplied to the gate of the PMOS transistor M100 in FIG. 2. Gates of the PMOS transistors M118 and M120 are coupled together and to a drain of the PMOS transistor M120. The PMOS transistor M118 has a current path formed between the power supply voltage VDD and the ground voltage VSS through the NMOS transistor M119. A gate of the NMOS transistor M119 is connected together to both a drain thereof and a terminal 36 for outputting a bias voltage BIAS4. The bias voltage BIAS4 is supplied to the gate of the NMOS transistor M105 in the N-channel input section 120. The NMOS transistor M117 has a gate connected to the gate of the NMOS transistor M119 and a current path formed between both the terminal 34 (i.e., the drain of the PMOS transistor M116) and the ground voltage VSS. Moreover, a current path of the PMOS transistor M120 is formed between the power supply voltage VDD and the terminal 28.

During an operation of the bias circuit 170', the PMOS transistors M118 and M120 form a current mirror and also the NMOS transistors M117 and M119 form a current mirror. A current mirror is a circuit in which an output current is forced to be equal to an input current. Accordingly, in the current mirror, the output current is a mirror image of the input current.

Sources of the PMOS transistors M122, M124A, M124B, M126 and M128 are coupled together and to the power supply voltage VDD and gates thereof are connected commonly to a drain of the PMOS transistor M128. The drain of the PMOS transistor M128 is connected to the ground voltage VSS through the current source $I_{BIAS}$. A gate and a drain of the PMOS transistor M122 are connected together to the terminal 30 for outputting a bias voltage BIAS2. The bias voltage BIAS2 is supplied to the gates of the PMOS transistors M108 and M109 in the cascode current mirror section 140. Drains of the NMOS transistors M121, M123 and M125 are connected to drains of corresponding PMOS transistors M120, M122 and M124A, respectively. The sources of NMOS transistors M121, M123 and M125 are connected to the ground voltage VSS and their gates are connected together and to the drain of the NMOS transistor M125. The PMOS transistor M124B has a drain connected to the drain of the NMOS transistor M125 through the switch element SW2, which is switched on/off by a clock signal CLK. Furthermore, the drains of the PMOS transistor M126 and the NMOS transistor M127 are connected together and to a terminal 38 for outputting a bias voltage BIAS3 which is supplied to the gates of the NMOS transistors M110 and M111. The NMOS transistor M127 has a source connected to the ground voltage VSS and a gate connected to the drain thereof. During operation (when the switch element SW2 is switched on by the clock signal CLK) the PMOS transistors M122, M124A, M124B, M126 and M128 and the NMOS transistors M121, M123 and M125 form current mirrors, as described above.

With the circuit configuration as shown in FIG. 2, the bias circuit 170' generates the bias voltages BIAS1 to BIAS6 when the clock signal CLK is changed from a logic low state (e.g., the ground voltage level VSS) to a logic high state (e.g., the power supply voltage VDD), so that the differential input stage 100 and the folded cascode gain stage 130 may operate normally during one half of a clock cycle (hereinafter, referred to as a normal mode of operation). On the contrary, the bias circuit 170' is inactivated when the clock signal CLK is changed from the logic high state to the logic low state, so that the differential input stage 100 and the folded cascode gain stage 130 do not operate normally during the other half of the clock cycle (hereinafter referred to as a power saving mode of operation). In a case where the operational amplifier 200 or 200' is used in a very large integrated circuit system using the clock signal CLK, bias currents from the bias circuit 170 and 170' are cut-off during one half cycle of the clock signal and are turned on during the other half cycle of the clock signal. Therefore, the operational amplifiers 200 and 200' according to the first and second embodiments consume less power.

If the bias voltages BIAS3 and BIAS4 are generated prior to the bias voltages BIAS1 and BIAS2 when a mode of the operational amplifier 200 or 200' is changed from the power saving mode of operation to the normal mode of operation, the transconductance $g_{mn}$ of the input stage 100 becomes more than the transconductance $g_{mp}$ of the PMOS transistor M109. As illustrated by the above equation, the phase margin (DPM at the output stage of the operational amplifier 200' may deteriorate as the transconductance of the input stage 100 is increased. Such an increase may also make the settling time at the output longer and result in the generation of an unstable output voltage VOUT signal. To limit instability and improve settling time, the $g_{mn}$ value should be maintained at a lower value than the $g_{mp}$ value.

However, when the clock signal CLK is changed from the logic low state to the logic high state, the bias circuit 170' generates the bias voltages BIAS1 and BIAS2 and then generates the bias voltages BIAS3 and BIAS4, so that the cascode current mirror section 140 is first enabled and then the differential input stage 100 is enabled. Accordingly, the phase margin $\Phi_{PM}$ may be improved (as shown by the above equation) by enlarging the transconductance $g_{mp}$ prior to the transconductance $g_{mn}$. By using this preferred sequential biasing scheme, the pole $\omega_{p2}$ is pushed to a higher frequency than $\omega_{unity}$ and the phase margin is thereby reduced. This results in a more stable output voltage VOUT signal when the mode of the operational amplifier 200 is in the power saving mode.

If bias currents (or, bias voltages) supplied from the bias circuit 170' in FIG. 2 are cut off entirely during the power saving mode of operation, it may be difficult to gain rapid operating speed when the mode of the operational amplifier 200 is converted from the power saving mode of operation to the normal mode of operation. However, by enabling a predetermined current to be supplied into the differential input stage 100 and the folded cascode gain stage 130 through the PMOS transistor M124A (which is always turned on regardless of the mode of operation of the operation amplifier 200'), the fully differential folded cascode CMOS operational amplifier 200' can also operate at high speed at the mode conversion time. Here, the bias voltages BIAS3 and BIAS5 are each supplied to the cascode current source section 150 and the common mode feedback section 160 regardless of the mode of operation of the operational amplifier 200', but the generation of these voltages does not significantly impact the overall power consumption of the operational amplifier 200'.

Figure 3:
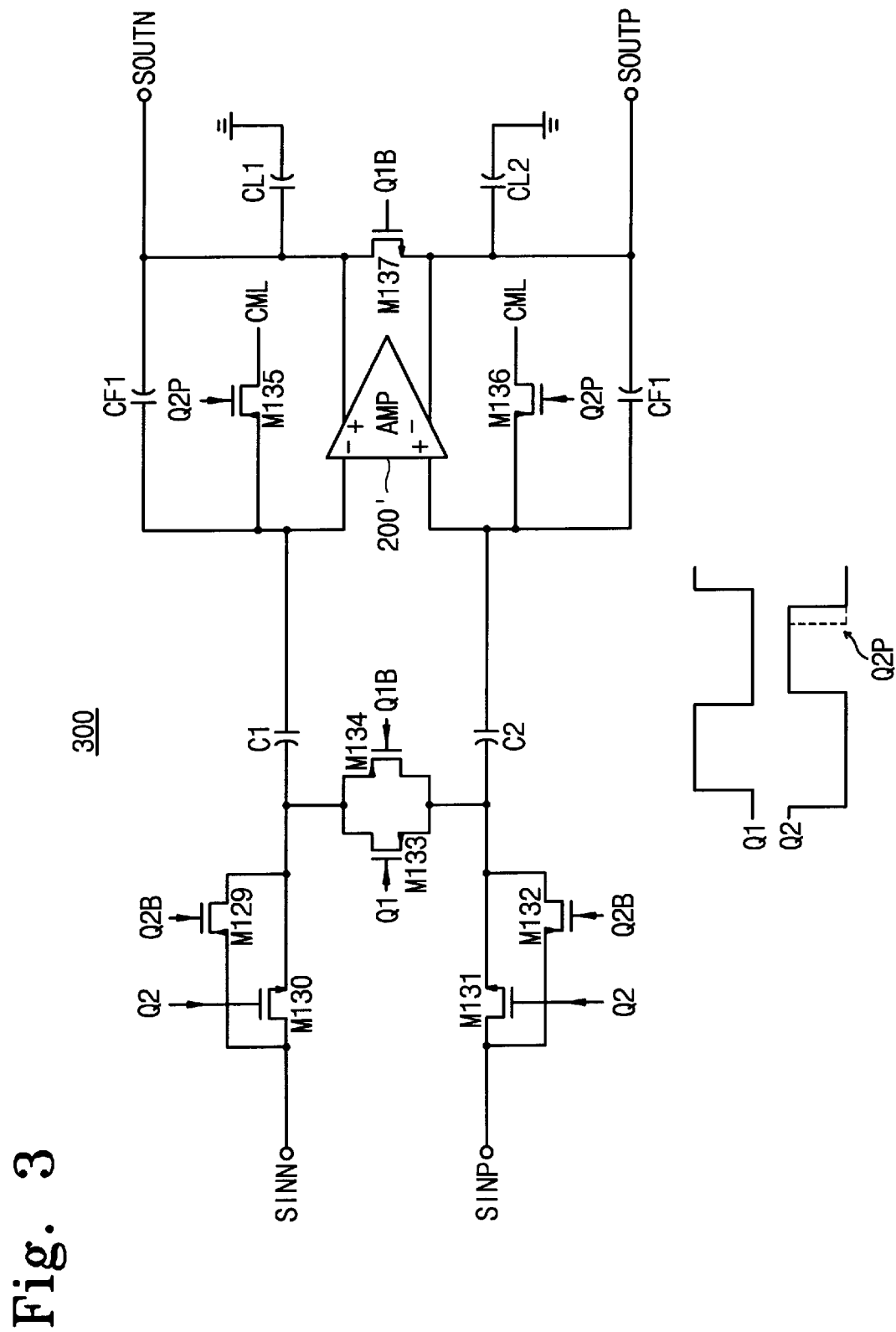
FIG. 3 is an electrical schematic of a sample and hold circuit which includes the operational amplifier of FIG. 2.
Figure 4:
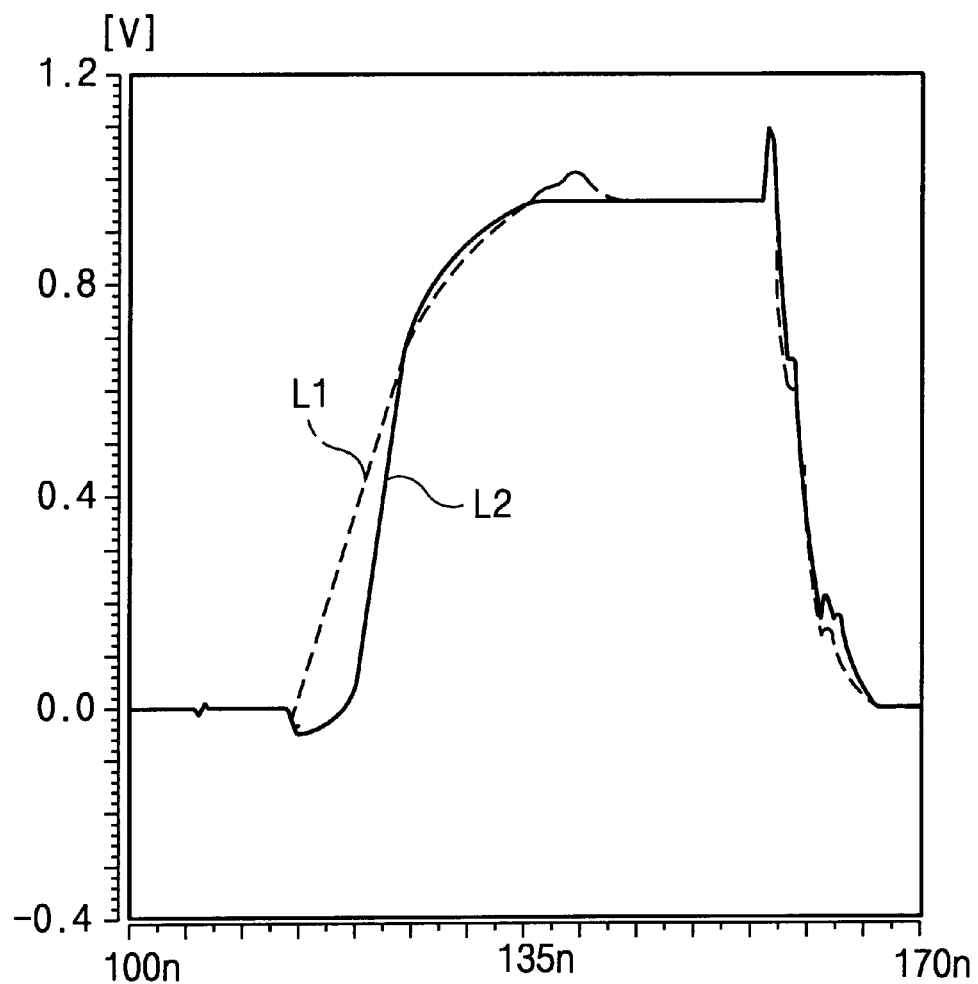
FIG. 4 is a graph of output signal waveforms for the sample and hold circuit of FIG. 3 at various transconductance ratios.

Referring to FIG. 3, a schematic diagram of a sample and hold circuit 300 is shown. This circuit 300 includes a fully differential folded cascode CMOS operational amplifier 200' having a common mode feedback section 160 and the bias circuit 170' illustrated by FIG. 2. Here, the output signal waveform of the sample and hold circuit 300 is depicted in FIG. 4. In FIG. 4, the dotted line L1 represents the output signal waveform during mode conversion when $g_{mn}$ is greater than $g_{mp}$ and the solid line L2 represents the output signal waveform when $g_{mn}$ is less than $g_{mp}$. As illustrated by line L1, the output signal overshoots and the settling time is relatively long. However, as illustrated by line L2, the output signal does not overshoot and the settling time is relatively short.

Figure 5:
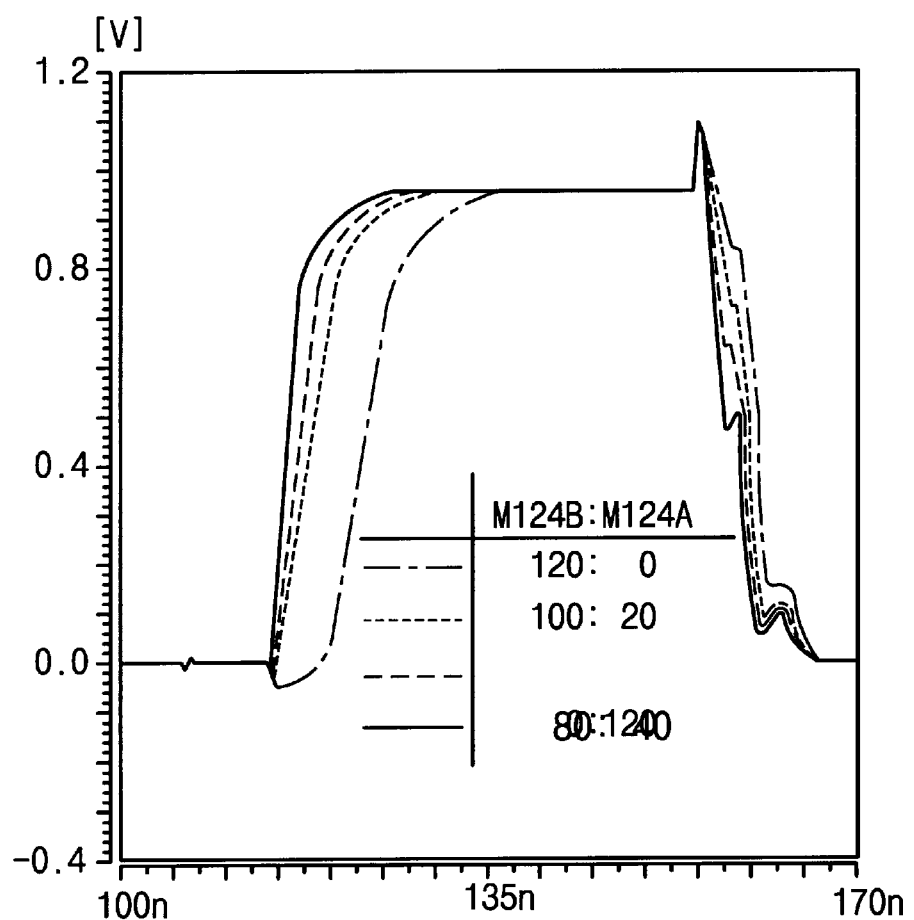
FIG. 5 is a graph of output signal waveforms for the sample and hold circuit of FIG. 3 at various current ratios.
Figure 6:
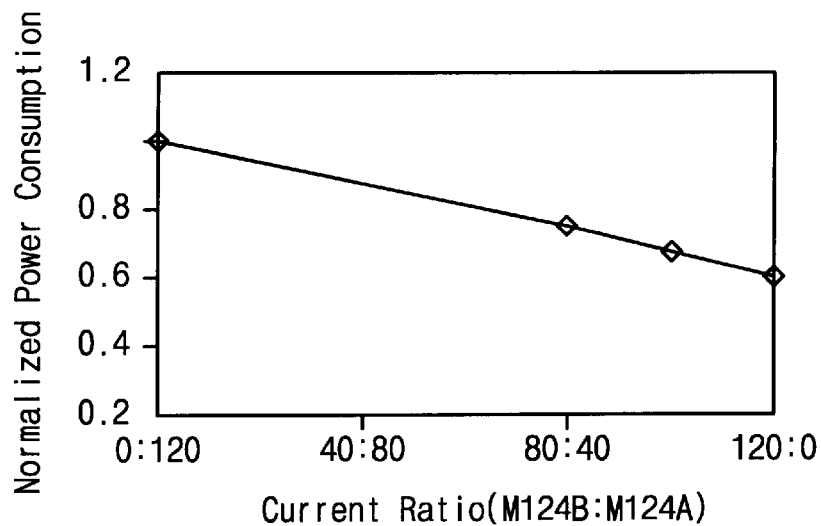
FIG. 6 is a graph which illustrates normalized power consumption requirements of the sample and hold circuit of FIG. 3 versus current ratio.
Figure 7:
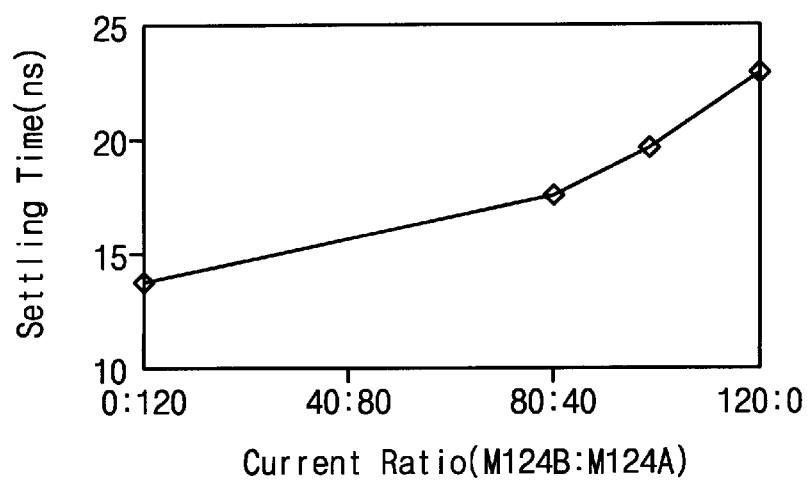
FIG. 7 is a graph which illustrates settling time of the output signal of FIG. 3 versus current ratio.

When the ratios of the amount of current flowing through the PMOS transistor M124A to the amount of current flowing through the PMOS transistor M124B are changed according to the following ratios 0:120, 40:80, 100:20 and 120:0 during the power saving mode of operation, the output signal waveforms of the sample and hold circuit 300 are as illustrated by FIG. 5. The current ratio of the PMOS transistor M124A should be changed to reduce overall power consumption, but in system applications necessitating a high slew rate of output voltage, such as a high speed image processing system, the ratio should be optimized. A diagram showing the overall power consumption of the sample and hold circuit 300 according to the current ratio is illustrated in FIG. 6. FIG. 6 is depicted as normalized to '1' (a case that the sample and hold circuit 300 operates under the normal mode of operation in which the largest power of 10 mW is consumed). FIG. 7 shows a settling time of the output voltage signal from FIG. 3 according to the current ratios. As illustrated in FIG. 6, as the current is reduced, the settling time is increased. On the contrary, it can be known that an overall power consumption of the sample and hold circuit is reduced by 42%.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An operational amplifier integrated circuit, comprising:
    a differential input stage;
    a cascode current mirror electrically coupled to said differential input stage and between a differential output and a first reference potential;
    a cascode current source electrically coupled to said differential input stage and between the differential output and a second reference potential; and
    means, electrically coupled to said differential input stage, said cascode current mirror and said cascode current source, for sequentially enabling said cascode current mirror and then said differential input stage in response to a first control signal transition.

2. The circuit of claim 1, wherein said sequentially enabling means comprises means for disabling said cascode current mirror, said cascode current source and said differential input stage in response to a second control signal transition.

3. The circuit of claim 2, wherein said differential input stage comprises first and second differential amplifiers; wherein the first differential amplifier has a differential output electrically coupled to said cascode current mirror; and wherein the second differential amplifier has a differential output electrically coupled to said cascode current source.

4. The circuit of claim 3, wherein the first differential amplifier comprises first and second NMOS transistors having respective gate electrodes electrically coupled to a differential input; and wherein the second differential amplifier comprises first and second PMOS transistors having respective gate electrodes electrically coupled to the differential input.

5. The circuit of claim 4, wherein the first differential amplifier comprises a third NMOS transistor having a drain electrode electrically connected to source electrodes of the first and second NMOS transistors; and wherein the second differential amplifier comprises a third PMOS transistor having a drain electrode electrically connected to source electrodes of the first and second PMOS transistors.

6. The circuit of claim 5, wherein the third NMOS transistor has a gate electrode and a source electrode electrically connected to said sequentially enabling means and the second reference potential, respectively; and wherein the third PMOS transistor has a gate electrode and a source electrode electrically connected to said sequentially enabling means and the first reference potential, respectively.

7. The circuit of claim 2, wherein the first control signal transition is a rising edge of a clock signal and wherein the second control signal transition is a falling edge of the clock signal.

8. The circuit of claim 6, further comprising a common mode feedback circuit; and wherein said sequentially enabling means comprises means for generating first through sixth bias signals on first through sixth bias signal lines, respectively.

9. An operational amplifier integrated circuit, comprising:
a differential input stage;
a cascode current mirror electrically coupled to said differential input stage and between a differential output and a first reference potential;
a cascode current source electrically coupled to said differential input stage and between the differential output and a second reference potential;
means, electrically coupled to said differential input stage, said cascode current mirror and said cascode current source, for sequentially enabling said cascode current mirror and then said differential input stage in response to a first control signal transition; and
a common mode feedback circuit; and
wherein said sequentially enabling means comprises means for generating first through sixth bias signals on first through sixth bias signal lines, respectively.

10. The circuit of claim 9, wherein said cascode current mirror is electrically connected to the first and second bias signal lines; wherein said cascode current source is electrically connected to the third bias signal line; wherein the gate electrode of the third NMOS transistor is electrically connected to the fourth bias signal line; wherein the common mode feedback circuit is electrically connected to the fifth bias signal line; and wherein the gate electrode of the third PMOS transistor is electrically connected to the sixth bias signal line.

11. The circuit of claim 10, wherein the first control signal transition is a rising edge of a clock signal and wherein the second control signal transition is a falling edge of the clock signal.

12. The circuit of claim 11, wherein said cascode current mirror comprises first and second current mirror sources; and wherein a transconductance of said differential input stage is less than a transconductance of the second current mirror source upon the rising edge of the clock signal.

13. The circuit of claim 11, wherein said cascode current mirror comprises first and second current mirror sources; and wherein a transconductance of said differential input stage is less than a transconductance of the second current mirror source upon the rising edge of the clock signal.

14. An operational amplifier integrated circuit, comprising:
a differential input stage;
a cascode current mirror electrically coupled to said differential input stage and between a differential output and a first reference potential;
a cascode current source electrically coupled to said differential input stage and between the differential output and a second reference potential; and
a bias signal generator, responsive to a clock signal and electrically coupled to said differential input stage, said cascode current mirror and said cascode current source, to sequentially enable said cascode current mirror and then said differential input stage in response to a first edge of the clock signal and disable said cascode current mirror and said cascode current source in response to a second edge of the clock signal.

15. The circuit of claim 14, wherein said differential input stage comprises first and second differential amplifiers; wherein the first differential amplifier has a differential output electrically coupled to said cascode current mirror; and wherein the second differential amplifier has a differential output electrically coupled to said cascode current source.

16. The circuit of claim 15, wherein the first differential amplifier comprises first and second NMOS transistors having respective gate electrodes electrically coupled to a differential input; and wherein the second differential amplifier comprises first and second PMOS transistors having respective gate electrodes electrically coupled to the differential input.

17. The circuit of claim 16, wherein the first differential amplifier comprises a third NMOS transistor having a drain electrode electrically connected to source electrodes of the first and second NMOS transistors; and wherein the second differential amplifier comprises a third PMOS transistor having a drain electrode electrically connected to source electrodes of the first and second PMOS transistors.

18. The circuit of claim 17, wherein the third NMOS transistor has a gate electrode and a source electrode electrically connected to said bias signal generator and the second reference potential, respectively; and wherein the third PMOS transistor has a gate electrode and a source electrode electrically connected to said bias signal generator and the first reference potential, respectively.

19. The circuit of claim 8, wherein said cascode current mirror is electrically connected to the first and second bias signal lines; wherein said cascode current source is electrically connected to the third bias signal line; wherein the gate electrode of the third NMOS transistor is electrically connected to the fourth bias signal line; wherein the common mode feedback circuit is electrically connected to the fifth bias signal line; and wherein the gate electrode of the third PMOS transistor is electrically connected to the sixth bias signal line.

20. The circuit of claim 19, wherein the first control signal transition is a rising edge of a clock signal and wherein the second control signal transition is a falling edge of the clock signal.

21. The circuit of claim 20, wherein said cascode current mirror comprises first and second current mirror sources;

and wherein a transconductance of said differential input stage is less than a transconductance of the second current mirror source upon the rising edge of the clock signal.

22. The circuit of claim 20, wherein said cascode current mirror comprises first and second current mirror sources; and wherein a transconductance of said differential input stage is less than a transconductance of the second current mirror source upon the rising edge of the clock signal.

* * * * *